United States Patent [19]
Hirakata

[11] Patent Number: 5,334,944
[45] Date of Patent: Aug. 2, 1994

[54] DIFFERENTIAL AMPLIFIER CIRCUIT FOR ENHANCING SMALL VOLTAGE SIGNALS

[75] Inventor: Noriyuki Hirakata, Kanagawa, Japan

[73] Assignee: Sumitomo Electric Industries, Ltd., Osaka, Japan

[21] Appl. No.: 168,399

[22] Filed: Dec. 17, 1993

Related U.S. Application Data

[63] Continuation of Ser. No. 899,526, Jun. 16, 1992, abandoned, which is a continuation-in-part of Ser. No. 709,885, Jun. 4, 1991, abandoned.

[30] Foreign Application Priority Data

Jun. 4, 1990 [JP] Japan .................. 2-145827

[51] Int. Cl.$^5$ .................. H03F 15/00; H03F 1/02
[52] U.S. Cl. .................. 330/6; 330/9
[58] Field of Search .................. 324/117 R, 207.2; 330/6, 9, 51

[56] References Cited

U.S. PATENT DOCUMENTS 4,134,030 1/1979 Pace .................. 330/6 X
4,138,649 2/1979 Schaffer .................. 330/9

FOREIGN PATENT DOCUMENTS 0080306 5/1985 Japan .................. 330/6

*Primary Examiner*—Steven Mottola
*Attorney, Agent, or Firm*—Cushman, Darby & Cushman

[57] ABSTRACT

A differential amplifier circuit suitable for amplifying a faint signal, such as the output of a magnetic sensor including a Hall element. The differential amplifier circuit includes switching units which are provided at the input and output terminals of a differential amplifier to switch the polarity of the input and output signals, and low pass filters which are provided at the output terminals to remove the switching frequency component from the output signal, thus working as an ideal amplifier with no offset voltage. Furthermore, by alternating the polarity of driving current of the Hall element for inverting the polarity of the input signal of the differential amplifier, an error voltage of the Hall element caused by location error of the output electrodes and the voltage drop across them can be eliminated at the same time.

6 Claims, 6 Drawing Sheets

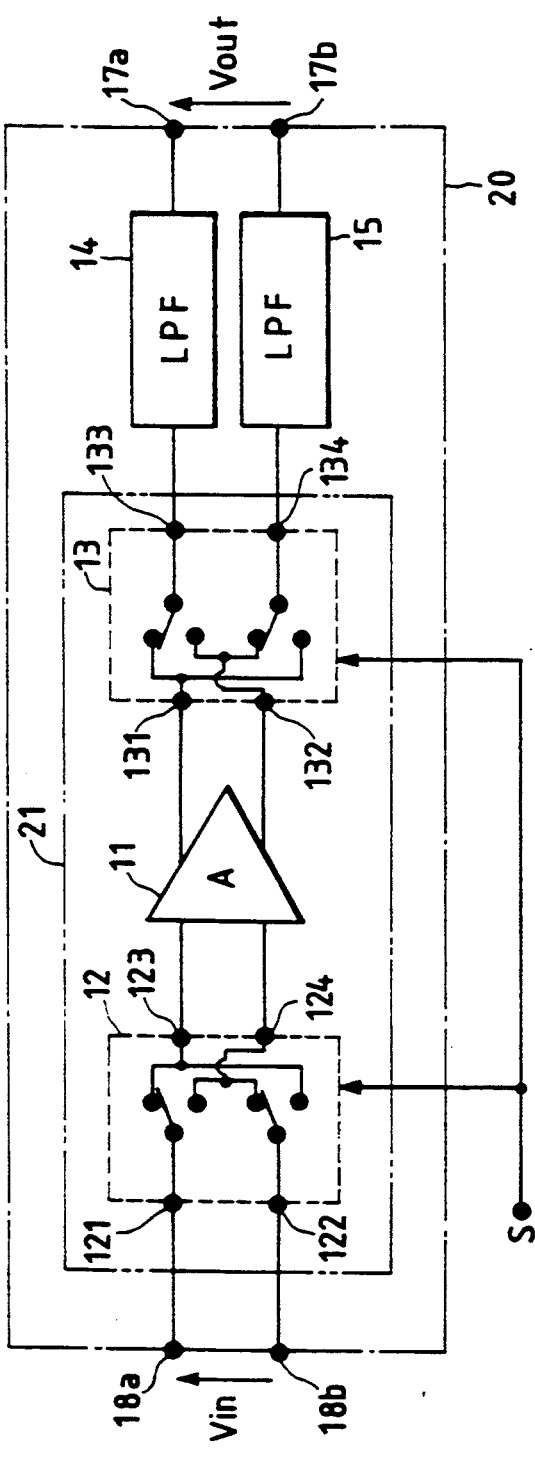
FIG. 1
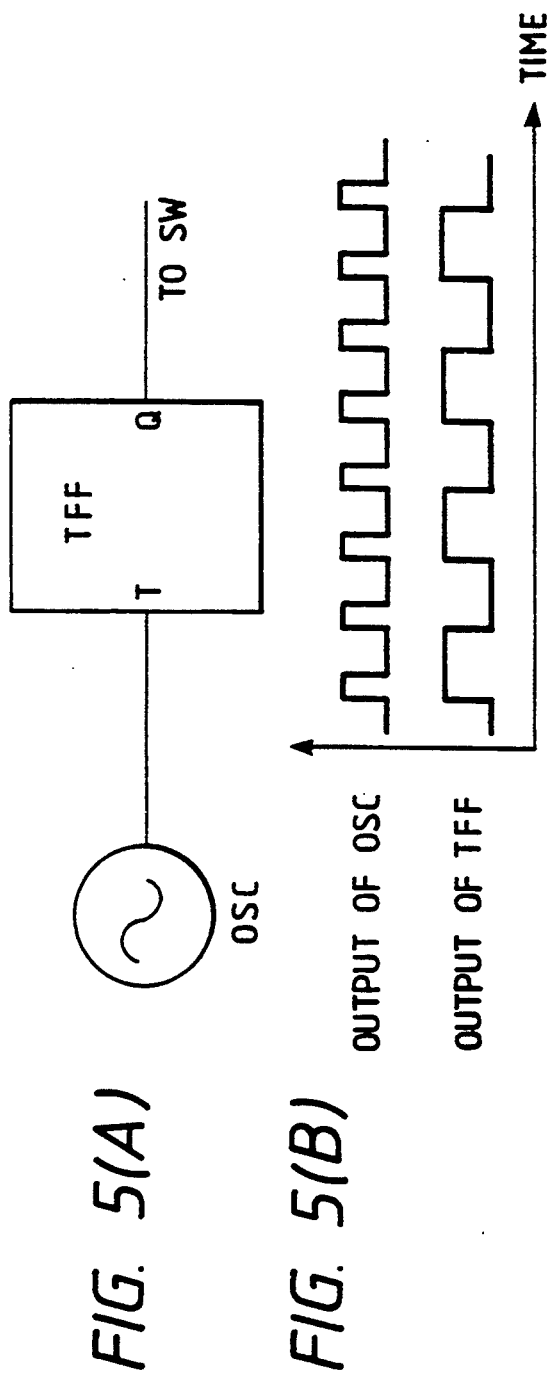
FIG. 5(A)
FIG. 5(B)

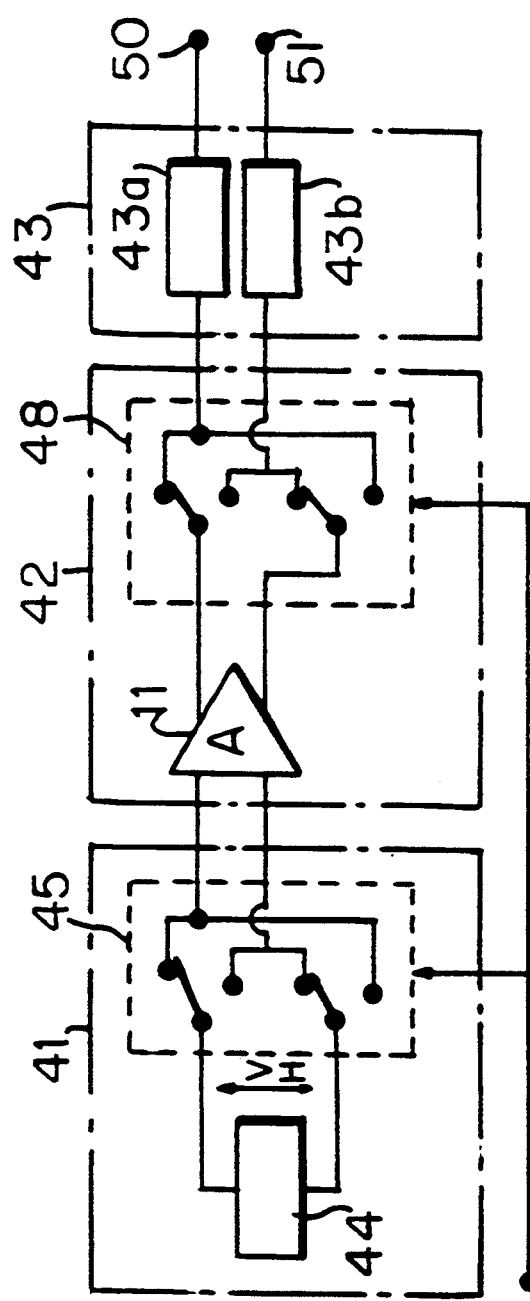
FIG.6
FIG.7
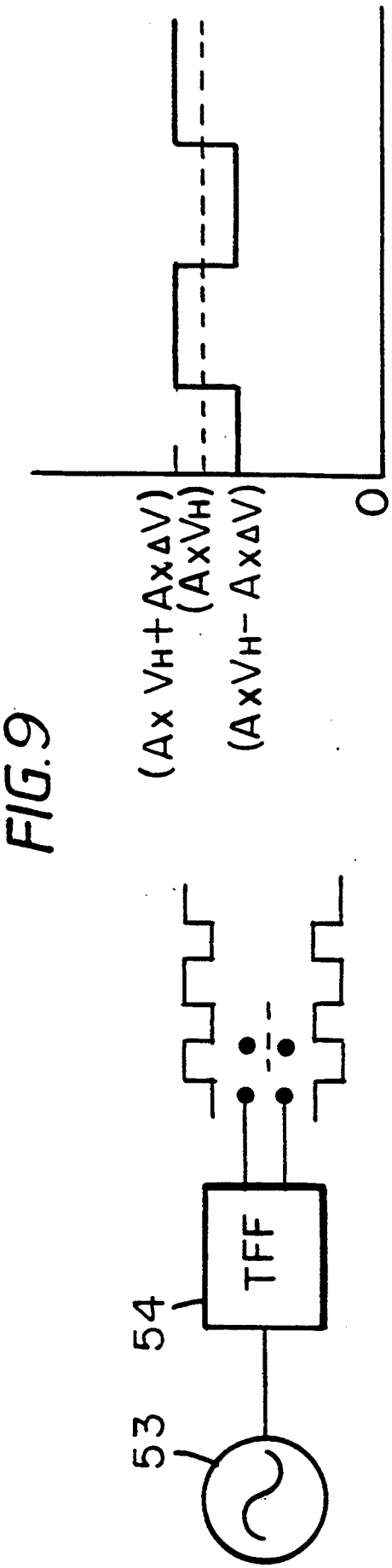
FIG.9

DIFFERENTIAL AMPLIFIER CIRCUIT FOR ENHANCING SMALL VOLTAGE SIGNALS

This is a continuation of application Ser. No. 07/899,526, filed on Jun. 16, 1992, which was abandoned upon the filing hereof which in turn is a continuation-in-part of Application Ser. No. 07/709,885 filed Jun. 4, 1991 now abandoned.

BACKGROUND OF THE INVENTION

1. Field of Invention

The present invention relates to a differential amplifier circuit.

2. Description of the Prior Art

A differential amplifier is suitable for amplifying a faint signal such as the output of a sensor. It is able to effectively reduce the adverse effects of noise.

The forward threshold voltage of an Si bipolar junction transistor is determined by a band gap which is a physical constant of Si, therefore an Si bipolar junction transistor is not significantly affected by fluctuations in manufacturing process. With Si bipolar junction transistors being used as active input elements for differential amplifiers, it is possible to achieve a small offset voltage (several tens $\mu V$). Accordingly, silicon (Si) bipolar junction transistors have been generally used as active input elements for differential amplifiers. However, if ambient temperature becomes considerably higher than room temperature, excited electrons jump from a valence band into a conduction band in such an Si bipolar junction transistor, thus preventing normal operation.

There have been various attempts to construct a differential amplifier from a transistor of a material other than Si, such as GaAs or the like, where the material has a larger band gap than Si so that the transistor can withstand a high temperature environment. At present, field effect transistors (FETs) using new materials, such as GaAs or the like, are widely used.

FIG. 4 (Prior Art) is a circuit diagram showing a differential amplifier using GaAs MESFETs. In FIG. 4, reference numerals 1 and 2 designate input terminals respectively; 3 and 4, output terminals; 5 and 6, GaAs MESFETs; 7 and 8, load elements; 9, a constant-current regulated power source; 10, a high potential side power supply terminal; and 11, a low potential side power supply terminal.

In a differential amplifier as shown in FIG. 4, the difference in threshold voltages between FETs 5 and 6 causes an equivalent input offset voltage. The threshold voltage of an FET depends on the concentration of impurities doped below a gate electrode. Therefore, the threshold voltage varies extremely depending on the manufacturing process. Accordingly, in the case of a differential amplifier as shown in FIG. 4, the equivalent input offset voltage of several tens mV is often present. Then, the output voltage becomes a value of the equivalent input offset voltage multiplied by a gain of the differential amplifier thereby resulting in an occurrence of an extremely large error.

SUMMARY OF THE INVENTION

An object of the present invention is to overcome the problems of the conventional differential amplifier circuit as discussed above.

The present invention provides a differential amplifier circuit having input terminals which comprises:

a first switching unit for inverting the polarity of a signal representing a potential difference between the input signals;

a differential amplifier for amplifying an output of the first switching unit;

a second switching unit for inverting the polarity of an output signal of the differential amplifier in synchronization with the switching of the first switching unit; and a filter for removing an AC component from an output signal from the second switching unit, the output of the low-pass filter being the output of the differential amplifier circuit.

When the first switching means and the second switching means are switched in accordance with a switching control signal having a duty ratio of 50%, a voltage is output which has both an amplitude twice as much as that of an offset voltage, and a central value equal to the voltage that occurs as if the differential amplifier circuit functioned ideally. An AC component of this voltage is removed by the low pass filter, so that a DC component of the same, that is, the voltage in the case of an ideal, differential amplifier is obtained as the output voltage.

An additional object of the present invention is to combine a magnetic sensor, including a Hall element, and the aforementioned differential amplifier.

With this combination, the polarity of the output voltage of the magnetic sensor is switched by switching the polarity of the Hall element driving circuit. As a result of the combination, the voltage drops occurring in a resistance component of the Hall element are eliminated.

BRIEF DESCRIPTION OF THE INVENTION

In the accompanying drawings:

FIG. 1 is a circuit diagram showing an embodiment of the present invention;

FIGS. 2(a) to 2(c) are diagrams of input/output characteristics of the inside differential amplifier circuit;

FIG. 5(a) is a circuit diagram showing an example of a switching circuit; and

FIG. 5(b) is a waveform diagram showing a waveform of outputs of an oscillator and a toggle flip-flop circuit.

FIG. 6 is a circuit diagram showing a second embodiment of the present invention.

FIG. 7 is a circuit diagram showing a second example of switching circuit.

FIGS. 8(a) to 8(c) are diagrams of input/output characteristics of the second embodiment of the differential amplifier circuit.

FIG. 9 is a diagram showing a waveform of an output signal of the second embodiment of the differential amplifier circuit.

Figure 10:
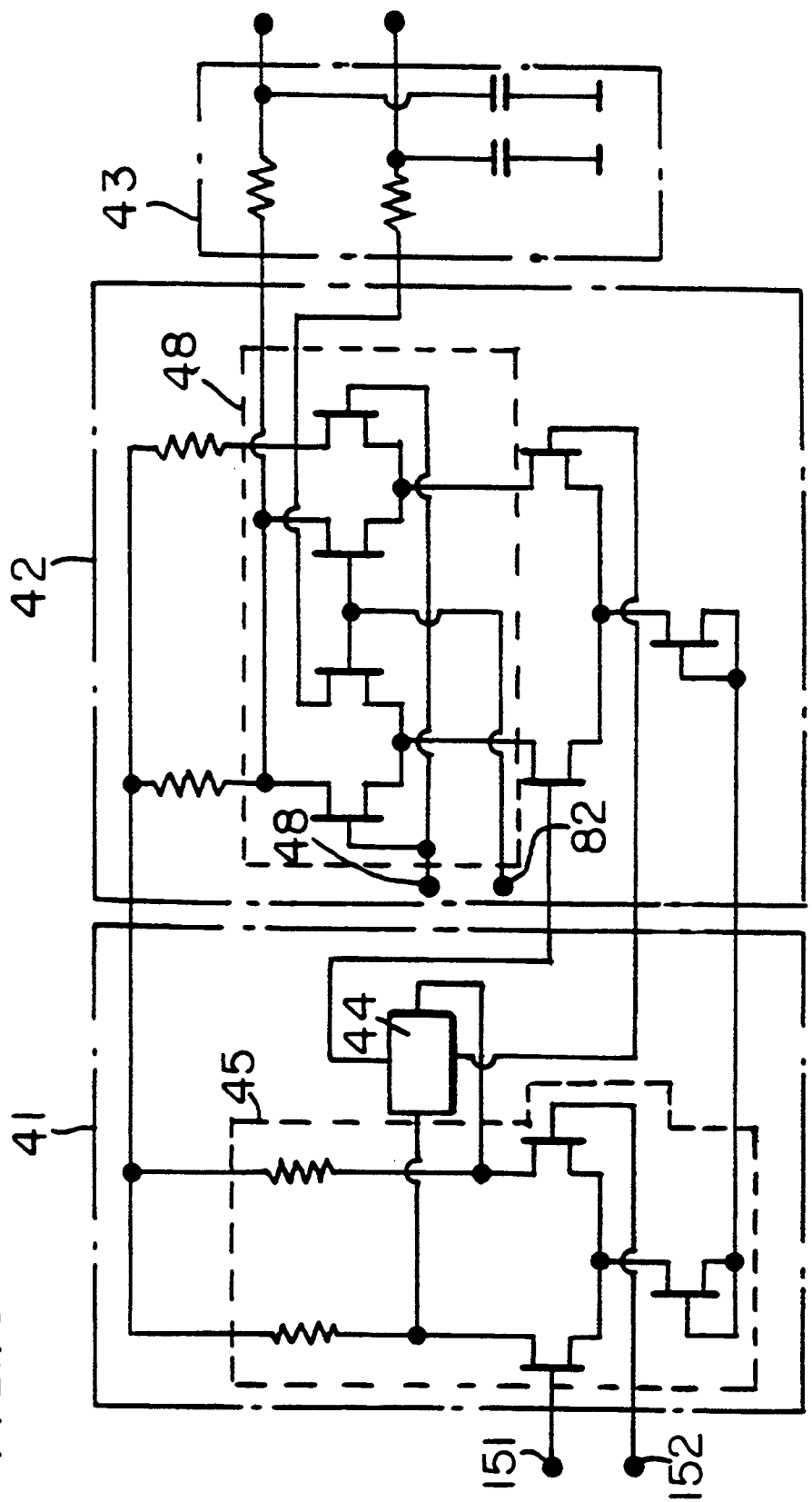

FIG. 10 is a circuit diagram of yet another embodiment of the present invention.

DESCRIPTION OF THE PREFERRED EMBODIMENT

Figure 4:
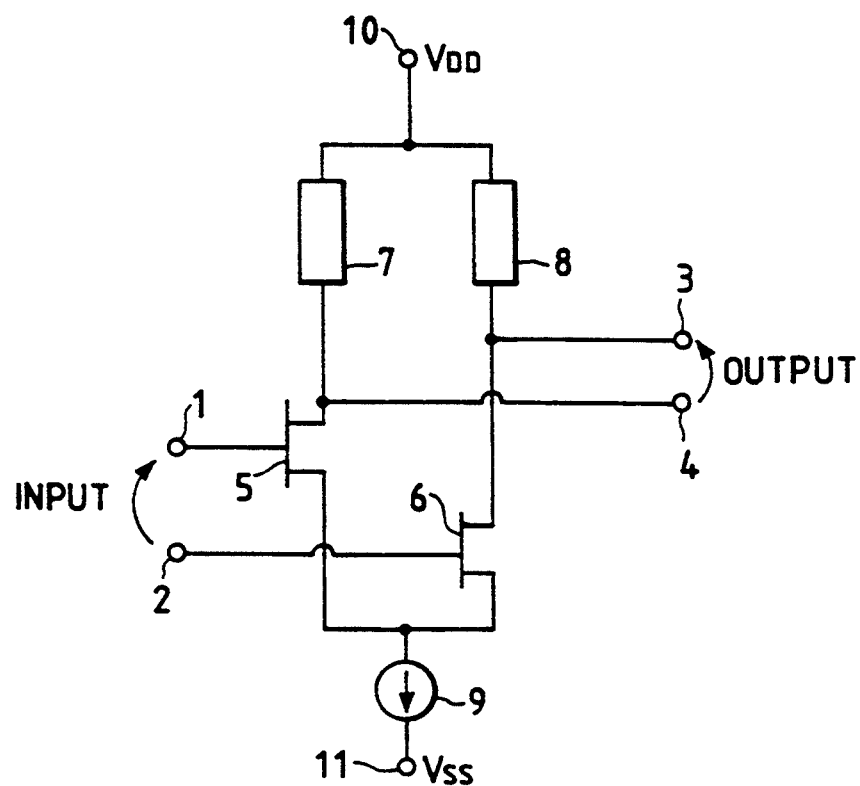
FIG. 4 (Prior Art) is a circuit diagram of a differential amplifier using GaAs MESFETs.

FIG. 1 is a block diagram showing an embodiment of the present invention. A differential amplifier 11 employs GaAs MESFETs as active input elements. An example of the differential amplifier 11 is as shown in FIG. 4. The differential amplifier 11 has a gain A and has an equivalent input offset voltage of $+A\Delta V$. A first switching unit 12, including a pair of switches, is provided on the input side of the differential amplifier 11. Input terminals 121 and 122 of the first switching unit 12 are connected to input terminals 18a and 18b of a differential amplifier circuit 20, respectively, so as to perform polarity inversion switching of input voltage $V_{in}$ applied across the input terminals 18a and 18b. Output terminals 123 and 124 of the first switching unit 12 are connected to the two input terminals of the differential amplifier 11 respectively. A second switching unit 13 is provided on the output side of the differential amplifier 11. The second switching unit 13 which includes a pair of switches has the same function as the first switching unit 12, to perform polarity inversion switching of the voltage applied to across the input terminals, in this case 131 and 132, thereof. Low pass filters 14 and 15 are connected to output terminals 133 and 134 of the second switching unit 13, respectively. The output terminals of the low pass filters 14 and 15 are connected to output terminals 17a and 17b of the differential amplifier circuit 20, respectively.

Figure 2A:
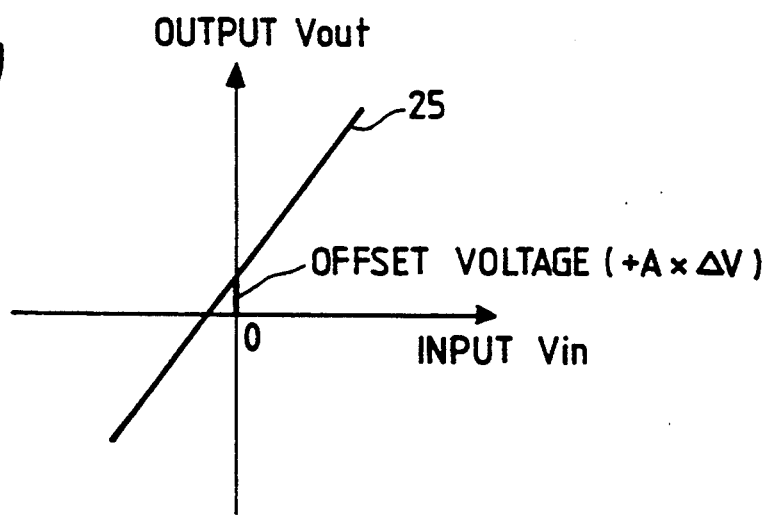
Figure 2B:
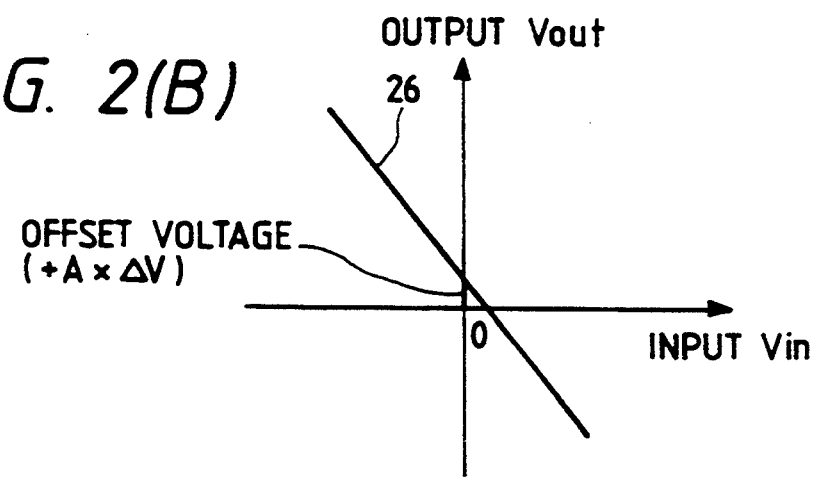
Figure 2C:
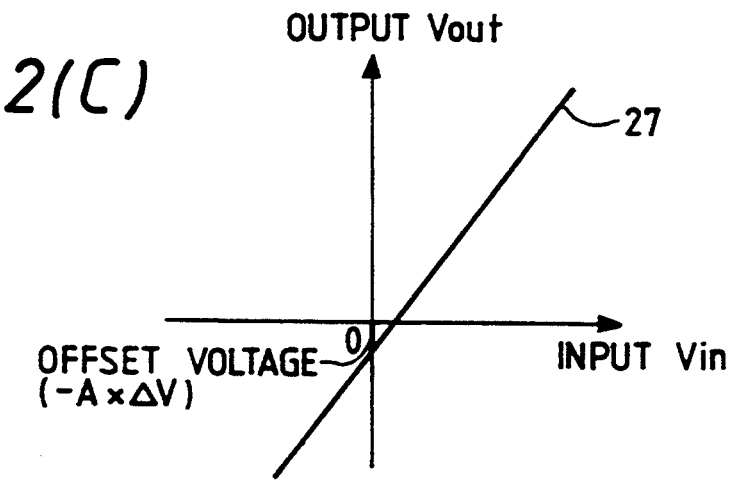

The relationship between the input voltage $V_{in}$ which is applied across the input terminals 121 and 122 of the first switching unit 12 and an output voltage $V_{out}$ which is obtained across the output terminals 133 and 134 of the second switching unit 13. That is, an input/ output characteristic of an inside differential amplifier circuit 21 will be described, where differential amplifier circuit 21 has the first switching unit 12 and the second switching unit 13 coupled with the differential amplifier 11. In both the first switching unit 12 and the second switching unit 13, the connection state in which polarity is not inverted (the connection state shown in FIG. 1) is referred as a first position and the connection state in which polarity is inverted is referred as a second position. FIG. 2(A) shows the input/output characteristic in the case where both the first switching unit 12 and the second switching unit 13 are in the first position, which is an original input/output characteristic of the differential amplifier 11. A characteristic curve 25 has a positive slope where offset voltage $(+A \times \Delta V)$ is obtained by multiplying an equivalent input offset voltage $(+\Delta V)$ by the gain A. FIG. 2(B) shows an input/output characteristic in the case where only the first switching unit 12 is switched to the second position. A characteristic curve 26 in FIG. 2(B) has a negative slope with the same offset voltage $(+A \times \Delta V)$ and the same polarity as the curve 25. FIG. 2(C) shows an input/output characteristic where both the first switching unit 12 and the second switching unit 13 are in the second position. In this case, a characteristic curve 27 has a positive slope, like the characteristic curve 25, but the polarity of the offset voltage is inverted to a value of $(-A \times \Delta V)$.

The differential amplifier circuit 20 of this embodiment uses the characteristics of FIGS. 2(A) and 2(C). Operation of this embodiment is described hereunder.

A binary switching control signal S having a duty ratio of 50% is applied commonly to the first switching unit 12 and the second switching unit 13. Both the first switching unit 12 and the second switching unit 13 are in the first position when the switching control signal is a high level "H", and are in the second position when the switching control signal is a low level "L". Accordingly, the inside differential amplifier circuit 21 shows the input/output characteristic of FIG. 2(A) when the switching control signal S is high "H", while, shown the input/output characteristic of FIG. 2(C) when the switching control signal S is low "L". Assuming that the output voltage of the inside differential amplifier circuit 21 is $V_{01}$ when the switching control signals is "H", $$V_{01} = A \times (V_{in} + \Delta V) \qquad (1)$$
$$= A \times V_{in} + A \times \Delta V$$

Assuming that the output voltage of the inside differential amplifier circuit 21 is $V_{02}$ when the switching control signal is "L", $$V_{02} = A \times (V_{in} + \Delta V) \qquad (2)$$
$$= A \times V_{in} - A \times \Delta V$$

Figure 3:
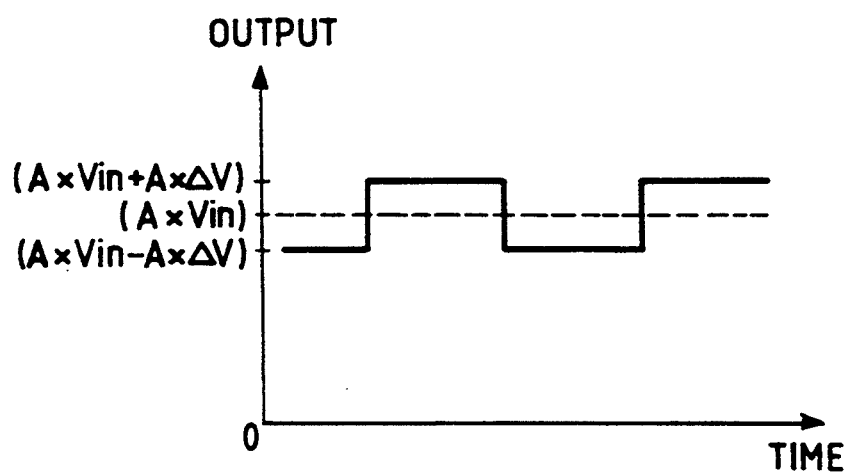
FIG. 3 is a diagram showing a waveform of an output signal of the inside differential amplifier circuit.

Accordingly, the output voltage of the inside differential amplifier circuit 21 shows a waveform having a center of $A \times V_{in}$ and an amplitude of $2 \times A \times \Delta V$. FIG. 3 shows a waveform of an output voltage of the inside differential amplifier circuit 21 when the input voltage $V_{in}$ is constant. In FIG. 3, the central output voltage $A \times V_{in}$ of the inside differential amplifier circuit 21 is indicated by a dotted line and the actual output voltage is indicated by a solid line.

The output voltage of the inside differential amplifier circuit 21 appears across the output terminals 17a and 17b through the low pass filters 14 and 15. Cut-off frequencies of the low pass filters 14 and 15 are selected to be sufficiently lower than the frequency of the switching control signals. Accordingly, the output voltage obtained across the output terminals 17a and 17b is a time-averaged DC component because an AC component is removed from the output voltage of the inside differential amplifier circuit 21, that is, the output voltage becomes a value of $A \times V_{in}$ which is equal to an output voltage of an ideal differential amplifier having no offset voltage.

A preferred use of the differential amplifier circuit according to the present invention will be described.

As mentioned above, the differential amplifier circuit of the invention is used to amplify output of various sensors. An example of such sensors is a sensor which is provided with a Hall element to detect the crank angle of a rotation shaft of a combustion engine, thereby accomplishing control of air/fuel ratio, ignition timing and the like. This type sensor is likely to be subjected to very high temperature because the sensor is disposed in the vicinity of the engine due to limited space in an engine room. It follows that the differential amplifier circuit provided to amplify the sensor output is subjected to the same high temperature. In view of the above, an element such as a GaAs device which is extremely responsive under high ambient temperature is selected as an active element in the amplifier circuit.

More specifically, when the differential amplifier circuit is being employed to amplify the output of the sensor for detecting the rotation angle of the crank shaft, it is assumed that the maximum rotation speed of an ordinary combustion engine is approximately 12,000 rpm, that is 12,000/60 =200 Hz. If a resolution power for detecting the rotation angle of the crank shaft is set to 1°, 200×360=72,000, that is, a filtering frequency of a low-pass filter is selected to be higher 72 KHz. If a differential amplifier is employed, which includes a GaAs device suitable for high speed operation, the device has a switching transient less than 1 nsec., thus the switching frequency of the switching units is set to less than 10 MHz. In this case, it should be noted that it is unnecessary to set the switching frequency at an exact value if it is less than 10 MHz and is sufficiently higher than 72 KHz. However, it is imperative that the switching signal has a duty ratio of 50%.

FIG. 5(A) is a diagram showing an example of a circuit capable of producing a switching signal having the above mentioned 50% duty ratio requirement. The circuit comprises an oscillator such as a multivibrator or a ring oscillator, for example, and a toggle flip-flop circuit TFF operable in response to a clock signal produced by the oscillator. FIG. 5(B) is a diagram showing an example of waveforms of output signals of the oscillator and the TFF circuit.

Although the differential amplifier 11 using GaAs MESFETs as amplifying active elements is used in this embodiment, a differential amplifier using FETs made of another material as amplifying active elements may be used as well. Further, the amplifying active elements of the differential amplifier are not limited to FETs but may be bipolar junction transistors.

FIG. 6 is a block diagram showing another embodiment of the present invention. A sensor circuit of this embodiment is provided for detecting magnetism, and is constituted by a magnetism sensor 41, a differential amplifier circuit 42, and a low pass filter means 43. The magnetism sensor 41 includes a Hall element 44 for converting magnetism into a voltage by using a Hall effect, and a switching means 45 for switching the polarity of an output voltage $V_H$ of the Hall element 44. The switching means 45 inversely switches the polarity of the output voltage $V_H$ on the basis of a switching control signal which is a binary signal of a 50% duty ratio supplied from a terminal 49. In the switching means 45, it is defined that a state of connection (illustrated state) in which the polarity is not inverted between the input and output is referred to as a first position and another state in which the polarity is inverted is referred to as a second position. FIG. 7 is a view showing an example of a switching control signal generating circuit which is constituted by an oscillator 53 and a TFF (T type flip-flop circuit) 54 for ½ frequency dividing an output of the oscillator 53. The reason why the TFF 54 is used is that it is possible to make on duty ratio of the output of the oscillator 53 per se be 50%. A first switching control signal $\phi$ and a second switching control signal $\overline{\phi}$ which are complementary to each other are output from the TFF 54, and whether only the first switching control signal $\phi$ is to be used or both the first and second switching control signals $\phi$ and $\overline{\phi}$ are to be used is determined at the side of switching means to be controlled.

The differential amplifier circuit 42 includes both a differential amplifier 47 having a gain A, and a switching means 48 for switching the polarity of an output voltage of the differential amplifier 47. The differential amplifier 47 is constituted by a GaAs MESFET as an active input device. Similar to the switching means 45, the switching means 48 operates to invert the polarity of a voltage across the two input terminals on the basis of an externally supplied switching control signal. The switching means then output the polarity-inverted voltage therefrom. Also, in this switching means 48, it is defined that a connection state (illustrated state) in which the polarity is not inverted between the input and output is referred to as a first position and another state in which the polarity is inverted is referred to as a second position. The switching control signal supplied to the switching means 45 from the terminal 49 is also used commonly by the switching means 48.

The low pass filter means 43 has low pass filters 43a and 43b, respectively, connected to the two output terminals of the differential amplifier circuit 42.

Figure 8:
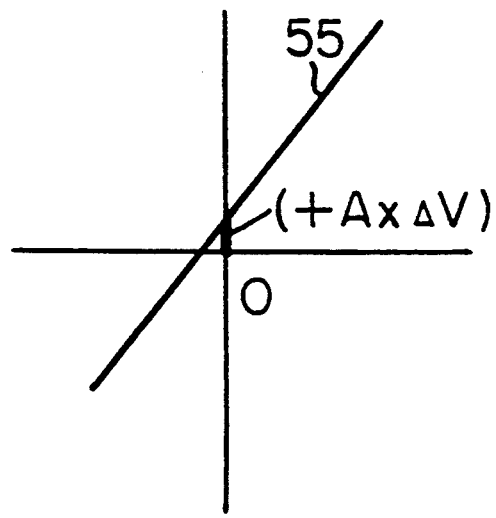
Figure 8:
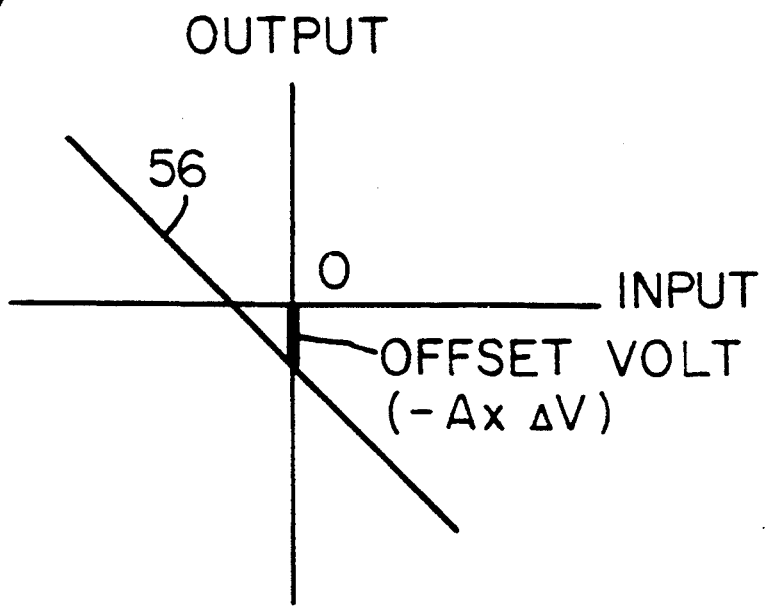
Figure 8:
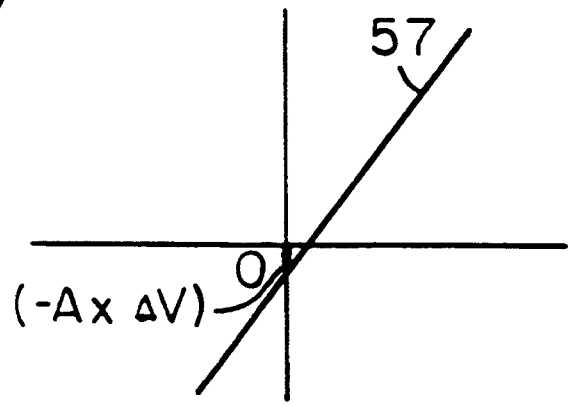

FIG. 8 (A) shows the input/output characteristic of the differential amplifier 47. A characteristic curve 55 has a positive slope having an offset voltage $(+A \times \Delta V)$ obtained by multiplying an equivalent input offset voltage $(+\Delta V)$ by the gain A. In the case where the switching means 48 is in the first position, as shown in FIG. 6, the input/output characteristic of the differential amplifier circuit 42 is the same as that shown in FIG. 8(A). If the switching means 48 is switched so as to be in the second position, however, the input/output characteristic of the differential amplifier circuit 42 becomes as shown in FIG. 8(B). That is, a characteristic curve 56 at that time has a negative offset voltage $(-A \times \Delta V)$ with a negative slope, but the absolute value of the slope is the same as that of the curve 55. Accordingly, the differential amplifier circuit 42 generate either one of the input/output characteristics of FIG. 8(A) and FIG. 8(B) in accordance with the state of the switching control signal.

In the magnetism sensor 42, on the other hand, the switching means 45 is switched in synchronism with the switching means 48. That is, the output voltage $V_H$ of the Hall element 44 is input into the differential amplifier circuit. 42 The polarity of the voltage $V_H$ is left as it is when the switching means 45 is in the first position, while the output voltage $V_H$ is input into the differential amplifier circuit 42 with inverted polarity of the voltage $V_H$ when the switching means 45 is in the second position. Accordingly, in view of the Hall element 44, the output voltage $V_H$ of the Hall element 44, with the polarity of the voltage $V_H$ as it is, is input into the differential amplifier circuit 42 with the input/output characteristics of FIG. 8(A). Alternatively, the output voltage with the inverted polarity is input into the differential amplifier circuit, having the input/output characteristic of FIG. 8(B). If a configuration in which the switching means 45 is added to the differential amplifier circuit 42 is defined as an apparent differential amplifier in order to facilitate explanation, the input/output characteristics of the apparent differential amplifier viewed from the Hall element 44 become as shown in FIG. 8(A) when the switching means 45 and 48 are in the first position, while the input/output characteristics become as shown in FIG. 8(C) when the switching means 45 and 48 are in the second position. In FIG. 8(C), a characteristic curve 57 has a positive slope equal to that of the characteristic curve 55, but the polarity of the offset voltage is inverted so as to have a value of $(-A \times \Delta V)$.

The first switching means 42 and the second switching means 48 are in the first position when the switching control signal $\phi$ is of a high level "H". They are in the second position when the switching control signal $\phi$ is of a low level "L". Then, apparent differential amplifier demonstrates the input/output characteristics of FIG. 8 (A) when the switching control signal is of "H", while demonstrating the input/output characteristics of FIG. 8(C) when the switching control signal $\phi$ is of "L". The output voltage of the differential amplifier circuit 42 is $V_{01}$ when the switching control signal is of "H", and $$V_{01} = A \times (V_H + \Delta V) \quad (1)$$
$$= A \times V_H + A \times \Delta V$$

The output voltage of the differential amplifier circuit 42 is $V_{02}$ when the switching control signal is of "L" and, $$V_{02} = A \times (V_H - \Delta V) \quad (2)$$
$$= A \times V_H - A \times \Delta V$$

Accordingly, the output voltage of the differential amplifier circuit 42 is generally a waveform having a center of $A \times V_H$, and an amplitude of $2 \times A \times \Delta V$. FIG. 9 shows a waveform of an output voltage of the differential amplifier circuit 42 when the input voltage $V_H$ is constant. In FIG. 9, the central output voltage $A \times V_H$ of the differential amplifier 42 is indicated by a dotted line and the actual output voltage is indicated by a solid line.

The output voltage of the differential amplifier circuit 42 appears across the output terminals 50 and 51 through the low pass filter 43. Cut-off frequencies of the low pass filters 43a and 43b are selected to be sufficiently lower than the frequency of the switching control signal. Accordingly, the output voltage obtained across the output terminals 50 and 51 is a DC component obtained by time-averaging the output voltage of the differential amplifier circuit 42 after removal of an AC component therefrom. That is, the output voltage becomes a value of $A \times V_H$ which is equal to an output voltage of an ideal differential amplifier having no offset voltage.

FIG. 10 shows an example in which this embodiment is realized as an actual circuit. A differential switching means is employed as each of the switching means 45 and 48, and the input terminals 151, 152 and 181, 182 are supplied with the switching control signals $\phi$ and $\bar{\phi}$ respectively, from the switching control signal generating circuit shown in FIG. 7. The switching means 45 shown in FIG. 10, is not provided at the output side of the Hall element 44 as that shown in FIG. 6. Rather it is provided to switch the polarity of the Hall element driving current. However, the switching means 45 of FIG. 10 as well as that of FIG. 6, have substantially the same function of inverting the polarity of the output voltage of the Hall element 44. Further, if such a system in which the polarity of the output voltage of the magnetism sensor 41 is switched by switching the polarity of the Hall element driving current is employed like this circuit, there is an advantage that the offset voltage of the Hall element per se can be cancelled.

When this embodiment is employed as a car crank angle sensor, the highest speed of the engine is 12000 rpm, corresponding to 200 Hz. If the crank position is to be detected with resolution of 500, it is necessary to realize a sampling cycle of $500 \times 200 = 10^5$ per sec., that is, 100 KHz. Based on this, the frequency of the switching control signal $\phi$ and the time constant of each of the low pass filters 43a and 43b are determined. As the oscillator, if a free-running oscillator of TFF by means of SCFL (source coupled FET logic) which is the same in configuration as the TFF 54 and which is easy in connection is employed, it is possible to easily obtain an oscillator having an oscillation frequency of about 100 MHz with a current consumption of 0.5 mA. This value is sufficiently high in speed, relative to the sampling frequency of 100 KHz. Accordingly, if necessary, it is possible to obtain a switching control signal after performing 1/16, 1/32 frequency-dividing through additional connection of further TFFs in order to reduce the influence of switching transient condition. The time constant of each of the low pass filters 43a and 43b is designed so that the sampling cycle of 100 KHz can be followed and a frequency component of the switching control signal can be removed. When using such RC filters as shown in FIG. 10, it is desirable to select the time constant to be 1 μs. To this end, for example, resistors of 10 kΩ and capacitors of 100 pF may be used.

Further, although a differential amplifier which employs GaAs MESFETs as amplifier active elements is used in this embodiment, another differential amplifier which employs an FET of another material as an amplifier active element may be used. Further, the amplifier active element of the differential amplifier is not limited to an FET, but it may be, for example, an Si bipolar junction transistor.

Further, if a photoelectric conversion element is used in place of the Hall element 44, a sensor circuit for detecting a quantity of light can be realized, and, similarly, if a detection element is suitably selected, a sensor circuit for detecting another physical quantity can be realized.

As described above, in the differential amplifier circuit according to the present invention, the offset voltage is completely removed. Therefore even when GaAs MESFETs having large variations in the manufacturing process are used as active amplifying elements, the offset voltage caused by the process variations can be substantially removed. That is, substantially the same output as that of an ideal differential amplifier can be obtained.

What is claimed is:

1. A sensor circuit comprising:
    a magnetism sensor having a Hall element;
    a single differential amplifier circuit connected to said magnetism sensor for eliminating voltage drops occurring in a resistance component of the Hall element, for amplifying a signal generated by said magnetism sensor, and for generating an output signal corresponding to said amplification of said magnetism sensor output; and
    filter means for removing an AC component from said differential amplifier circuit output signal.

2. The sensor circuit of claim 1, wherein said Hall element converts magnetism into voltage using a Hall effect.

3. The sensor circuit of claim 1, wherein said differential amplifier circuit has input terminals to which input signals are applied from said sensor and comprises:
    a first switching means for inverting the polarity of a signal representing a potential difference between the input signals from said sensor;
    a differential amplifier for amplifying an output of said first switching means;
    a second switching means for inverting the polarity of an output signal of said differential amplifier in synchronization with the switching of said first switching means; and
    said filter means removing said AC component from an output of said second switching means to be output as an output of said differential amplifier circuit.

4. A differential amplifier circuit as defined in claim 3, wherein the switching of said switching means is carried out with a duty ratio of 50%.

5. A sensor circuit as defined in claim 3, wherein said switching of said first switching means eliminates voltage drops occurring in said Hall element.

6. A sensor circuit as defined in claim 3, wherein said filter means is a low-pass filter having a cut-off frequency lower than the frequency of the switching of said first and second switching means.

* * * * *